United States Patent
Zheng et al.

(10) Patent No.: US 10,670,786 B2
(45) Date of Patent: Jun. 2, 2020

(54) COLOR AMBIENT LIGHT SENSOR WITH TUNABLE FILTER

(71) Applicant: Apple Inc., Cupertino, CA (US)

(72) Inventors: Dong Zheng, Los Altos, CA (US); Ove Lyngnes, Carmel Valley, CA (US); Prashanth S. Holenarsipur, Fremont, CA (US); Serhan O. Isikman, Sunnyvale, CA (US); Tianbo Sun, Sunnyvale, CA (US); Tingjun Xu, San Jose, CA (US); Xianwei Zhao, Fremont, CA (US); Xingxing Cai, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 69 days.

(21) Appl. No.: 15/953,281

(22) Filed: Apr. 13, 2018

(65) Prior Publication Data

US 2019/0317258 A1  Oct. 17, 2019

(51) Int. Cl.
| | |
|---|---|
| G02B 5/28 | (2006.01) |
| G02B 26/00 | (2006.01) |
| G02B 27/30 | (2006.01) |
| G09G 3/20 | (2006.01) |
| H01L 31/02 | (2006.01) |

(Continued)

(52) U.S. Cl.
CPC ............. *G02B 5/288* (2013.01); *G01J 3/51* (2013.01); *G02B 5/282* (2013.01); *G02B 26/007* (2013.01); *G02B 27/30* (2013.01); *G09G 3/2003* (2013.01); *H01L 31/02019* (2013.01); *H01L 31/02165* (2013.01); *H01L 31/103* (2013.01); *G09G 2320/0626* (2013.01);

(Continued)

(58) Field of Classification Search
CPC combination set(s) only.
See application file for complete search history.

(56) References Cited

U.S. PATENT DOCUMENTS

| | | |
|---|---|---|
| 6,459,425 B1 | 10/2002 | Holub et al. |
| 6,760,475 B1 | 7/2004 | Miller |

(Continued)

OTHER PUBLICATIONS

Kucera, Jan et al., Towards Calm Displays: Matching Ambient Illumination in Bedrooms:, Proceedings of the ACM on Interactive, Mobile, Wearable and Ubiquitous Technologies 1.2 (Jun. 2017): 16.

*Primary Examiner* — Robin J Mishler
(74) *Attorney, Agent, or Firm* — Treyz Law Group, P.C.; G. Victor Treyz; Kendall W. Abbasi (57) ABSTRACT

An electronic device may be provided with a color ambient light sensor. The color ambient light sensor may be used to measure an ambient light spectrum over a wavelength range of interest. Control circuitry in the electronic device can take actions based on the measured ambient light spectrum such as adjusting the brightness and color cast of content on a display. A display may have a display cover layer. The color ambient light sensor can be mounted under the display cover layer and may receive ambient light through the display cover layer. The color ambient light sensor may have a tunable wavelength filter such as an electrically adjustable Fabry-Perot resonator. A light collimator may be interposed between the display cover layer and the Fabry-Perot resonator to collimate ambient light that is passed to the Fabry-Perot resonator. A light detector measures the light passing through the Fabry-Perot resonator.

19 Claims, 8 Drawing Sheets

(51) Int. Cl.
*H01L 31/103* (2006.01)
*G01J 3/51* (2006.01)
*H01L 31/0216* (2014.01)

(52) U.S. Cl.
CPC . *G09G 2320/0666* (2013.01); *G09G 2320/08* (2013.01); *G09G 2360/144* (2013.01)

(56) References Cited

U.S. PATENT DOCUMENTS

| | | | |
|---|---|---|---|
| 7,845,823 B2 | 12/2010 | Mueller et al. | |
| 2003/0169789 A1* | 9/2003 | Yoon | H01S 5/0687 372/32 |
| 2009/0159785 A1* | 6/2009 | Tsang | G02B 5/288 250/226 |
| 2013/0271846 A1* | 10/2013 | Boonekamp | G02B 5/045 359/641 |

* cited by examiner

COLOR AMBIENT LIGHT SENSOR WITH TUNABLE FILTER

BACKGROUND

This relates generally to electronic devices, and, more particularly, to light sensors for electronic devices.

Electronic devices such as laptop computers, cellular telephones, and other equipment are sometimes provided with light sensors. For example, ambient light sensors may be incorporated into a device to provide the device with information on current lighting conditions. Ambient light readings may be used in controlling the device. If, for example bright daylight conditions are detected, an electronic device may increase display brightness to compensate. Color ambient light sensors can detect changes in the color of ambient light so that compensating color cast adjustments can be made to displayed content.

It can be challenging to form a color ambient light sensor for an electronic device. If care is not taken, a color ambient light sensor may consume more space in an electronic device than desired or may lose accuracy when partially occluded.

SUMMARY

An electronic device may be provided with a color ambient light sensor. The color ambient light sensor may be used to measure an ambient light spectrum over visible light wavelengths or other wavelength range of interest. Control circuitry in the electronic device can take actions based on the measured ambient light spectrum such as adjusting the brightness and color cast of content on a display.

The color ambient light sensor may receive ambient light through a display cover layer. The color ambient light sensor may have a tunable wavelength filter such as an electrically adjustable Fabry-Perot resonator. A light collimator may be interposed between the display cover layer and the Fabry-Perot resonator to collimate ambient light that is passed to the Fabry-Perot resonator.

The control circuitry may use a light detector such as a photodiode to measure the ambient light that has passed through the Fabry-Perot resonator while the Fabry-Perot resonator is adjusted to sweep a passband of the Fabry-Perot resonator across the wavelength range of interest. A fixed filter such as an infrared-light-blocking-and-visible-light-transmitting filter may be interposed between the Fabry-Perot resonator and the photodiode. The color ambient light sensor may be compact and may be insensitive to occlusion-induced color inaccuracies.

DETAILED DESCRIPTION

Figure 1:
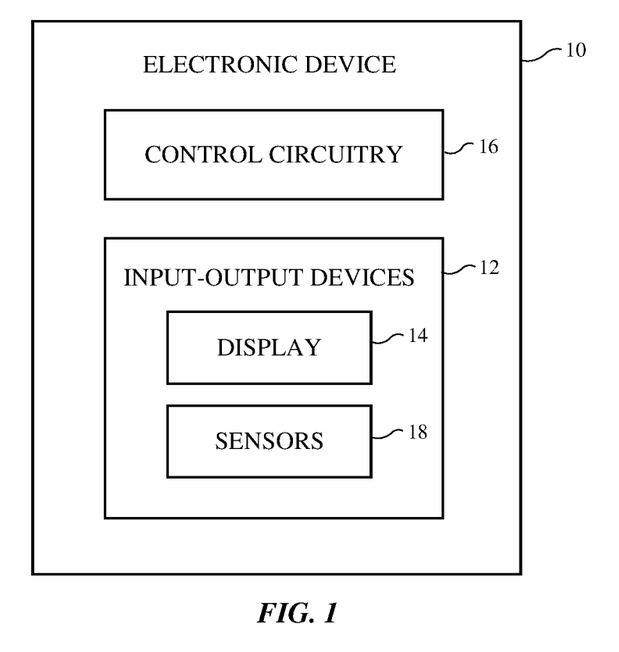
FIG. 1 is a schematic diagram of an illustrative electronic device having an ambient light sensor in accordance with an embodiment.

An illustrative electronic device of the type that may be provided with one or more light sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include a capacitive sensor, a light-based proximity sensor, a magnetic sensor, an accelerometer, a force sensor, a touch sensor, a temperature sensor, a pressure sensor, a compass, a microphone, and other sensors. Sensors 18 may also include one or more color ambient light sensors. A color ambient light sensor may be used to measure the color (color spectrum, color temperature, color coordinates, etc.) of ambient light and may be used to measure ambient light intensity.

To make color measurements, a color ambient light sensor in device 10 may have a light detector such as a photodiode that is overlapped by a tunable wavelength filter. The tunable wavelength filter may have a passband that is electrically adjustable. In one illustrative configuration, the tunable wavelength filter is an electrically adjustable Fabry-Perot resonator (sometimes referred to as a Fabry-Perot filter, Fabry-Perot interferometer, Fabry-Perot cavity, or Fabry-Perot etalon). During operation, the passband of the tunable filter can be swept across a wavelength range of interest (e.g., visible wavelengths and/or other wavelengths such as infrared and/or ultraviolet wavelengths) while capturing light intensity measurements with the photodiode. The captured data can be processed to produce an ambient light spectrum across the wavelength range of interest.

Using ambient light spectrum information, control circuitry 16 can produce ambient light color temperature measurements and other color measurements (e.g., colors represented in color coordinates, etc.). The ambient light spectrum information may be used in controlling display 14 and/or in taking other actions in device 10. As an example, display brightness may be automatically increased by control circuitry 16 in response to detection of bright ambient light conditions and may be automatically decreased by control circuitry 16 in response to detection of dim ambient light conditions. The color cast of images displayed on display 14 can be adjusted based on ambient light color measurement (e.g., to make the images on display 14 yellower in warm ambient lighting conditions and to make the images on display 14 bluer in cold ambient lighting conditions).

Figure 2:
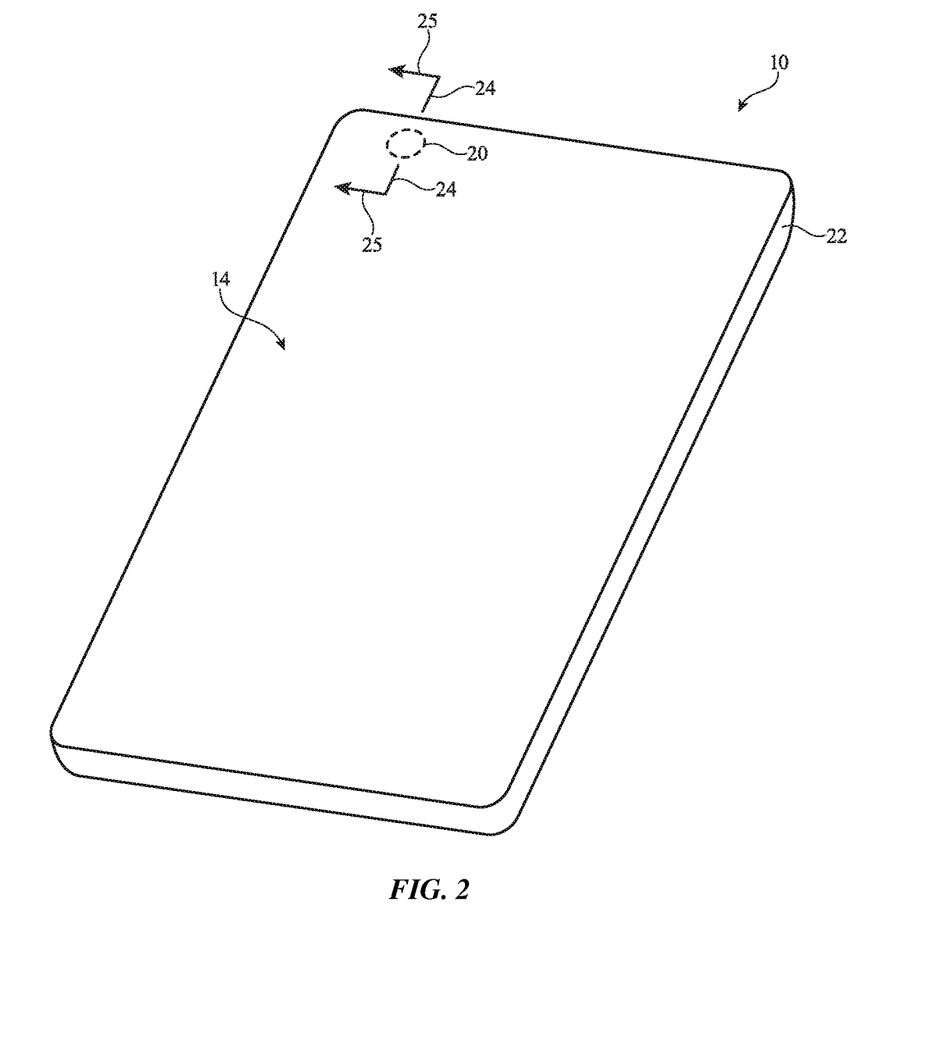
FIG. 2 is a perspective view of an electronic device with an ambient light sensor in accordance with an embodiment.

A perspective view of a portion of an illustrative electronic device is shown in FIG. 2. In the example of FIG. 2, device 10 includes a display such as display 14 mounted in housing 22. Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 may be formed using a unibody configuration in which some or all of housing 22 is machined or molded as a single structure or may be formed using multiple structures (e.g., an internal frame structure, one or more structures that form exterior housing surfaces, etc.).

Display 14 may be protected using a display cover layer such as a layer of transparent glass, clear plastic, sapphire, or other clear layer. Openings may be formed in the display cover layer. For example, an opening may be formed in the display cover layer to accommodate a button, a speaker port, or other components. Openings may be formed in housing 22 to form communications ports (e.g., an audio jack port, a digital data port, etc.), to form openings for buttons, etc.

Display 14 may be a liquid crystal display, an electrophoretic display, an organic light-emitting diode display or other display with an array of light-emitting diodes, may be a plasma display, may be an electrowetting display, may be a display based on microelectromechanical systems (MEMs) pixels, or may be any other suitable display. Display 14 may have an array of pixels that extend across some or all of the front face of device 10 and/or other external device surfaces. The pixel array may be rectangular or may have other suitable shapes.

Optical components (e.g., a camera, a light-based proximity sensor, an ambient light sensor, status indicator light-emitting diodes, camera flash light-emitting diodes, etc.) may be mounted in an inactive portion of the display (e.g., a portion of the display without pixels), may be mounted along an edge of housing 22, may be mounted on a rear housing wall, may be mounted in a location that allows light to pass between pixels in display 14, and/or may be mounted in any other suitable location in device 10. In one illustrative configuration, one or more openings (sometimes referred to as windows) may be formed in an opaque masking layer that is formed on an interior portion of the display cover layer for display 14. For example, a light component window such as an ambient light sensor window may be formed in a peripheral portion of the front face of device 10 such as region 20. Ambient light from the exterior of device 10 may be measured by an ambient light sensor in device 10 after passing through region 20 and the display cover layer in region 20. If desired, other portions of device 10 may be provided with window regions to receive ambient light (e.g., openings may be formed in housing 12, etc.).

Figure 3:
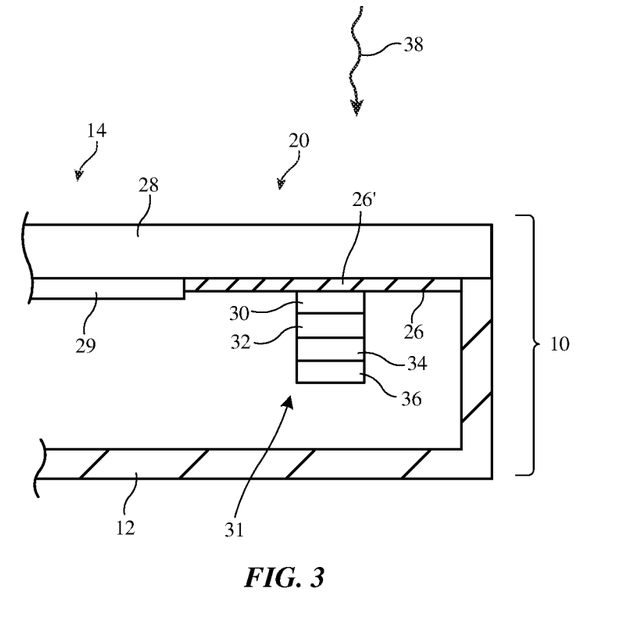
FIG. 3 is a cross-sectional side view of an illustrative ambient light sensor in an electronic device in accordance with an embodiment.

FIG. 3 is a cross-sectional side view of display 14 of FIG. 2 taken along line 24 and viewed in direction 25 of FIG. 2. As shown in FIG. 3, ambient light sensor 31 may be mounted in alignment with region (window) 20 (e.g., window 20 may overlap sensor 31). During operation, ambient light sensor 31 measures ambient light 38. Ambient light 38 may be produced by one or more light sources (i.e., the sun, artificial lighting, etc.). Ambient light 38 may reach device 10 directly and/or may be reflected towards device 10 from objects in the environment surrounding device 10. Ambient light 38 may be measured by ambient light sensor 31 after passing through window 20.

Display cover layer 28 may have a portion that covers the active area of display 14. Pixel array 29 (e.g., an organic light-emitting diode display, a liquid crystal display, and/or other display layers that produce images for display 14) may be formed under display cover layer 28 in the active area of display 14. Display cover layer 28 may also cover an inactive display area. Opaque masking layer 26 may cover the interior of display cover layer 28 in the inactive display area. Window 20 may be formed from a partially transparent region in opaque masking layer 26 on the inner surface of display cover layer 28.

Layer 28 may be formed from glass, plastic, ceramic, sapphire, or other transparent materials and may be a part of display 14 or a separate protective layer that covers active display structures. The opening associated with window 20 may be filled with window material 26'. Window material 26' may be material that is sufficiently transparent to allow at least some of light 38 to reach ambient light sensor 31. With one illustrative configuration, opaque masking layer 26 is formed from a material that is sufficiently opaque to block 99% or more or 99.5% or more of ambient light 38 and window material 26' is sufficiently transparent to allow ambient light sensor 31 to make measurements of color and intensity on light 38. Window material 26' may be, for example, an ink or other material(s) that allows 4% of light 38 to pass or may have other suitable transmissivity values (i.e., the transmissivity of window material 26' may be 2-10%, may be 2-6%, may be more than 1%, may be less than 10%, etc.). If desired, material 26' may be omitted, may be formed from a transparent material such as a clear polymer, etc. Configurations in which material 26' allows only a fraction of light 38 to pass may help enhance the appearance of device 10 by blocking light sensor 31 from view from the exterior of device 10.

Color ambient light sensor 31 may have one or more light detectors such as photodiode 36. Photodiode (photodetector) 36 may measure incoming ambient light 38 after light 38 has passed through material 26', light collimator 30, tunable filter 32, and a fixed wavelength filter such as filter 34 (e.g., an infrared-light-blocking-and-visible-light-transmitting filter). Color ambient light sensor control circuitry such as portions of control circuitry 16 may gather signals from photodiode 36 while sweeping a passband associated with tunable filter 32 across a wavelength range of interest. This allows control circuitry 16 to gather light spectrum measurements on ambient light 38.

Figure 4:
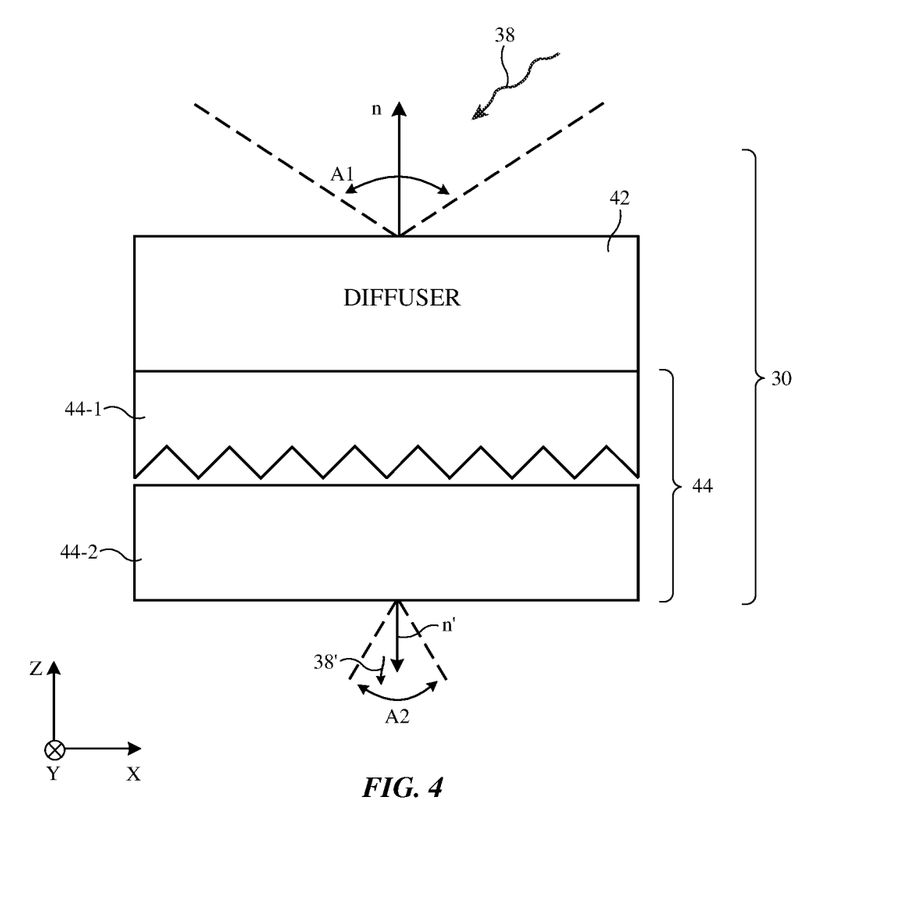
FIG. 4 is a cross-sectional side view of an illustrative light collimator in accordance with an embodiment.

Tunable filter 32 may be a wavelength-selective filter such as a tunable Fabry-Perot resonator. The Fabry-Perot resonator may, as an example, be an electrically adjustable microelectromechanical systems (MEMs) device having micromechanical mirror structures (e.g., MEMs diving board structures, etc.) with an electrostatically controlled mirror spacing to adjust the cavity length of the resonator. For satisfactory operation of the resonator, the angular range of ambient light 38 may be reduced by light collimator 30 before the ambient light passes through the resonator. A cross-sectional side view of light collimator 30 is shown in FIG. 4. In the illustrative configuration of FIG. 4, light collimator 30 has multiple layers such as light diffuser layer 42 and light collimator layer 44. Diffuser layer 42 may be formed form a clear polymer or other clear substrate material. Light-scattering particles (e.g., inorganic particles, bubbles, etc.) can be embedded in the substrate material and/or coated on one or more of the surfaces of the substrate material to form diffuser layer 42. The presence of light diffuser layer 42 may help homogenize incoming ambient light 38 before light 38 passes through light collimating layer 44 (e.g., layer 42 may help reduce the impact of specular highlights in light 38).

Light collimating layer 44 may collimate light using light refracting structures such as prism-shaped ridges. In the example of FIG. 4, light collimating layer 44 has two layers of prism structures: prism layer 44-1 and prism layer 44-2. Each prism layer (sometimes referred to as a brightness enhancement film or prism film) may have a substrate (e.g., a 200 micron polyethylene terephthalate substrate) with an ultraviolet-cured clear polymer coating impressed with prismatic structures or other prism-shaped light refracting structures. The coating of the prismatic structures may have a thickness of about 30 microns or other suitable thickness. Layers 44-1 and 44-2 may, as an example, each have a set of parallel prismatic ridges. The ridges of layer 44-1 may run perpendicular to the ridges of layer 44-2. The ridges of layer 44-1 may face downwardly (away from window 20 and toward photodiode 36) and the ridges of layer 44-2 may face upwardly (e.g., layers 44-1 and 44-2 may be arranged in a face-to-face configuration in which the ridges of these layers face each other). Other light collimating structures may be used in forming light collimator 44. The arrangement of FIG. 4 is illustrative.

Using light collimator 30 or other suitable light diffusing and collimating structures, incoming ambient light 38 that is distributed over a wide angular range A1 about surface normal n of the upper surface of collimator 30 may be collimated to form collimated ambient light 38' that is distributed over a narrow angular range A2 about surface normal n' of the lower surface of collimator 30. As an example, the full-width-half-maximum (FWHM) intensity of light 38 may cover an angular range A1 of 120° and the FWHM of light 38' may cover an angular range A2 of 40° (e.g., the angular spread of ambient light passing through window 20 may be reduced by a factor of at least 2, at least 3, at least 4, less than 10, or other suitable amount before this ambient light reaches filter 32.

Figure 5:
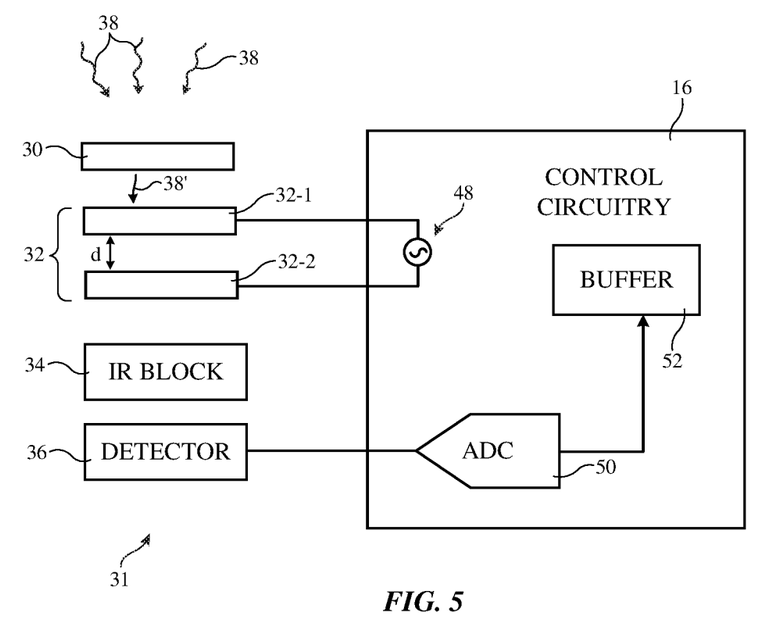
FIG. 5 is a circuit diagram of illustrative light sensor circuitry in accordance with an embodiment.

FIG. 5 is a diagram of color ambient light sensor 31 and associated control circuitry 16. As shown in FIG. 5, ambient light 38 may be collimated by light collimator 30 to produce collimated ambient light 38'. Light 38' may then pass through tunable filter 32. Tunable filter 32 may be a tunable Fabry-Perot resonator having partially transparent mirrors 32-1 and 32-2 separated by a distance d (the cavity length of the Fabry-Perot resonator). Control circuitry 16 may use a triangular wave signal source or other alternating-current signal generator 48 to apply an alternating-current control signal to tunable filter 32 to adjust the value of d. The control signal may, as an example, be a triangular wave that is modulated at a frequency of at least 1 kHz, at least 10 kHz, at least 100 kHz, at least 1 MHz, less than 100 MHz, less than 10 MHz, or other suitable modulation frequency. Infrared-light-blocking-and-visible-light-transmitting filter 34 (sometimes referred to as an infrared light blocking filter) may be formed from a thin-film interference filter (e.g., a stack of inorganic dielectric layers or other dielectric layers of alternating refractive index values). The layer index values and thicknesses are selected so that filter 34 transmits light with a wavelength range of interest for measurement by photodiode 36 (e.g., light from 400-800 nm) while blocking other light (e.g., infrared light with wavelengths longer than 800 nm). The presence of infrared blocking filter 34 helps reduce noise in photodetector 36 due to ambient light of wavelengths out of the wavelength range of interest.

While control circuitry 16 adjusts the spacing d of mirrors 32-1 and 32-2 to tune the passband of filter 32, control circuitry 16 gathers photodiode measurements from photodiode 36. In the illustrative configuration of FIG. 5, control circuitry 16 digitizes the output of photodiode 36 using analog-to-digital converter 50. As control circuitry 16 sweeps the passband of filter 32 across the wavelength range of interest, photodiode measurement data corresponding to each sweep can be stored in buffer 52 (e.g., the data can be added to a running average maintained in buffer 52). Averaged photodiode data corresponding to the measured ambient light spectrum can be read out of buffer 52 periodically (e.g., every 700 ms). Control circuitry 16 can use the measured ambient light spectrum data to take suitable actions (e.g., adjusting display brightness and color cast).

Figure 6:
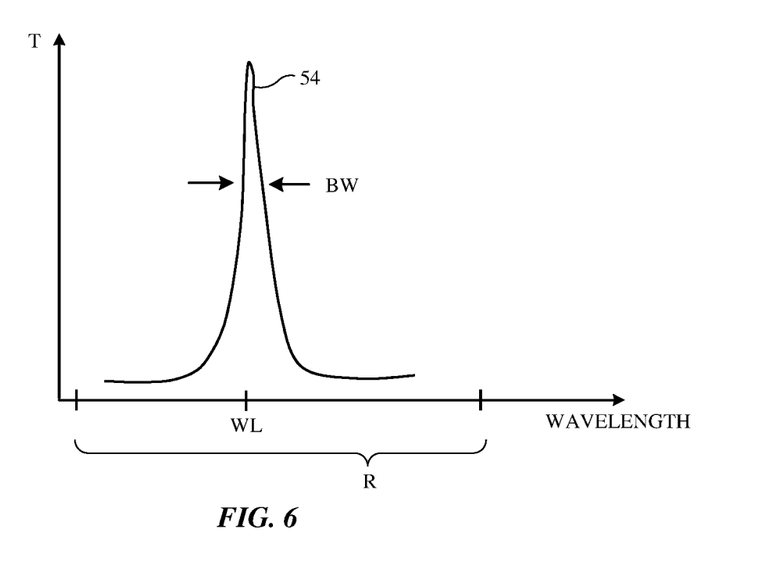
FIG. 6 is a graph showing the illustrative intensity versus wavelength response of a tunable wavelength light filter in accordance with an embodiment.

FIG. 6 is a graph of an illustrative light transmission characteristic for tunable filter 32. Curve 54 of the graph of FIG. 6 is a plot of light transmission T for filter 32 as a function of ambient light wavelength. The value of the control signal applied to filter 32 can be used to adjust mirror spacing d and thereby tune the location of the passband of filter 32 (e.g., the peak in transmission T). The bandwidth of the passband is determined by the finesse of the cavity formed from mirrors 32-1 and 32-2. With one illustrative configuration, the FWHM bandwidth BW of the pass band is 30-40 nm, at least 5 nm, at least 15 nm, less than 80 nm, or other suitable width. The location of the center of the passband (wavelength WL) is swept dynamically over a desired spectral measurement range R by control circuitry 16. Range R may cover some or all of the visible light wavelengths and/or other desired wavelengths (e.g., near-infrared and/or ultraviolet). With one illustrative configuration, range R spans from a short wavelength of 400 nm, a wavelength of less than 450 nm, or other suitable short wavelength to 800 nm, at least 650 nm, or other long wavelength, thereby covering most or all visible light wavelengths. Control circuitry 16 can use measurements over this spectral range or other wavelength range R in determining which actions to take in device 10.

Figure 7:
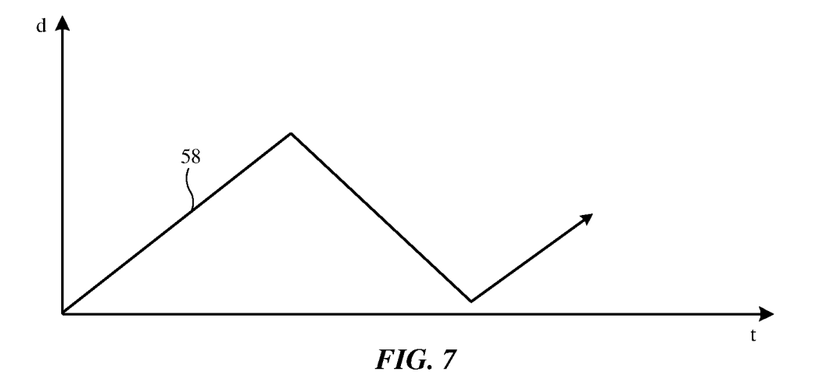
FIG. 7 is a graph of an illustrative triangular wave signal that may be used in controlling a tunable wavelength filter such as an electrically adjustable Fabry-Perot resonator in accordance with an embodiment.
Figure 8:
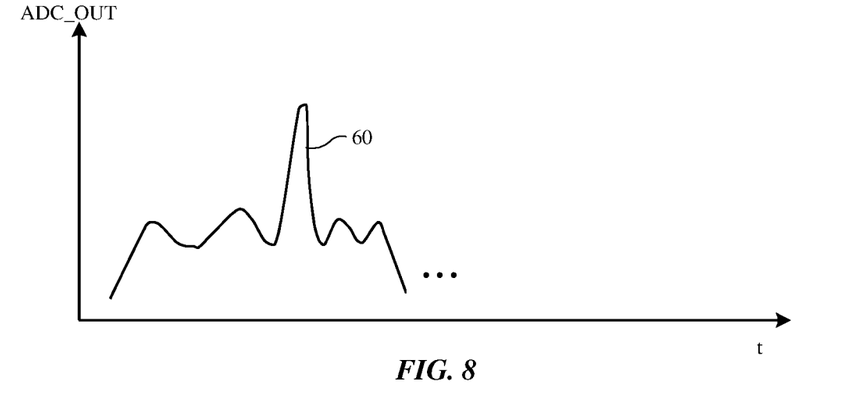
FIG. 8 is a graph of an illustrative photodiode response during Fabry-Perot resonator tuning operations in accordance with an embodiment.

FIG. 7 is a graph showing how mirror spacing d (the cavity length of the Fabry-Perot microelectromechanical systems device) can have a triangular wave characteristic (curve 58) when signal generator 48 produces a triangular wave control signal for filter 32. An illustrative corresponding output of analog-to-digital converter 50 as a function of time is shown by curve 60 in FIG. 8 (corresponding to a spectral measurement for one sweep of the wavelength range of interest).

Figure 9:
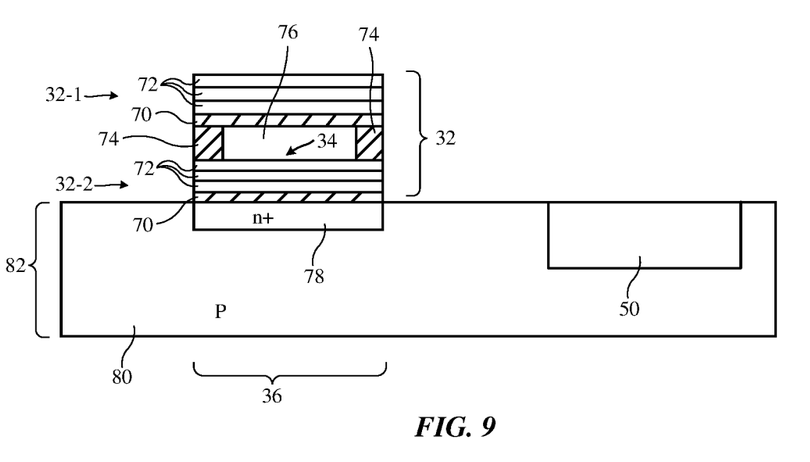
FIG. 9 is a cross-sectional side view of illustrative light sensor structures in accordance with an embodiment.

FIG. 9 is a cross-sectional side view of illustrative structures that may be used in forming color ambient light sensor 31. As shown in FIG. 9, photodiode 32 may be formed from an n+ well (well 78) in a p-type substrate (substrate 80). These structures form a p-n junction for photodiode 36. Substrate 80 may be formed from silicon or other semiconductor(s). Control circuitry (e.g., analog-to-digital converter circuitry and/or other control circuitry 50) may be formed in substrate 80 and may be electrically connected to photodiode 36 by interconnect paths formed from metal traces on substrate 80. Tunable filter 32 may be formed from mirrors 32-1 and 32-2 that are separated by air gap 76. Spacer structures such as silicon oxide spacers 74 at one or more ends of mirrors 32-1 and 32-2 may be used to establish a desired nominal separation distance d between the mirrors Each mirror may have a metal electrode 70 (e.g., an aluminum electrode or other reflective metal electrode) and an optional stack of optional dielectric layers 72. During operation, control circuitry 16 may supply a control voltage across the electrodes 70 using signal generator 48 (FIG. 5), thereby adjusting distance d by electrostatic force (attraction and repulsion). If desired, the dielectric layers 72 in mirror 32-1 may be configured to form a thin-film interference filter mirror structure that increase the reflectivity of mirror 32-1 to a desired amount. The dielectric layers 72 in mirror 32-2 (e.g., the layers 72 overlapping the metal electrode 70 in mirror 32-2) may also be used in forming a thin-film interference filter that blocks infrared light (e.g., some or all of layers 72 may be configured to form infrared-light-blocking-and-visible-light-transmitting filter 34).

In the illustrative arrangement of FIG. 9, filter 32 and filter 34 have been formed on the upper surface of substrate 80 (e.g., circuitry 50, photodiode 36, filter 32, and filter 34 are formed on a single integrated circuit substrate to form a single integrated component). If desired, filter 32 (and, if desired, filter 34) can be formed separately from substrate 80 (e.g., photodiode 36 and circuitry 50 may form an integrated circuit such as integrated circuit 82 that is separate from filter 32 (and, if desired filter 34). In another illustrative configuration, filter 32 may be formed on its own microelectromechanical systems device substrate and filter 32 (and, if desired, filter 34) may be separate from photodiode 36, which in turn is separate from circuitry 50. Other arrangements may be used, if desired.

Table of Reference Numerals

| 10 | Electronic Device | 12 | Input-Output Device |
| 14 | Display | 16 | Control Circuitry |
| 18 | Sensors | 20 | Window/Region |
| 22 | Housing | 24 | Line |
| 25 | Direction | 26 | Masking Layer |
| 26 | Window Material | 28 | Cover Letter |
| 29 | Pixel Array | 30 | Light Collimator |
| 31 | Light Sensor | 32 | Turnable Filter |
| 32-1 | Transparent Mirrors | 32-2 | Transparent Mirrors |
| 34 | Blocking Filter | 36 | Photodetector/Photodiode |
| 38 | Ambient Light | 38' | Light |
| 42 | Diffuser Layer | 44 | Collimator Layer |
| 44-1 | Prism Film Layer | 44-2 | Prism Film |
| 48 | Signal Generator | 50 | Control Circuitry |
| 52 | Buffer | 70 | Electrodes |
| 72 | Layers | 74 | Oxide Spacers |
| 76 | Air Gap | 78 | Well |

The foregoing is merely illustrative and various modifications can be made to the described embodiments. The foregoing embodiments may be implemented individually or in any combination.

What is claimed is:

1. An electronic device, comprising:
   a housing;
   a display in the housing;
   a color ambient light sensor having a tunable filter and having a photodiode that is configured to receive ambient light passing through the tunable filter; and
   control circuitry in the housing that is configured to:
      measure an ambient light spectrum for the ambient light by measuring signals from the photodiode while sweeping a passband of the tunable filter across a visible light spectrum; and
      adjust content on the display based on the measured ambient light spectrum.

2. The electronic device defined in claim 1 wherein the tunable filter is an electrically adjustable Fabry-Perot resonator and wherein the control circuitry is configured to measure the ambient light spectrum by adjusting the Fabry-Perot resonator to sweep the passband over a wavelength range between a first wavelength and a second wavelength.

3. The electronic device defined in claim 2 wherein the control circuitry includes an analog-to-digital converter configured to digitize signals from the photodiode.

4. The electronic device defined in claim 3 wherein the photodiode and the analog-to-digital converter are formed in a semiconductor substrate.

5. The electronic device defined in claim 4 wherein the Fabry-Perot resonator has at least one metal electrode formed on the semiconductor substrate.

6. The electronic device defined in claim 2 wherein the Fabry-Perot resonator is a microelectromechanical systems device with metal mirrors separated by an air gap.

7. The electronic device defined in claim 6 further comprising an infrared-light-blocking thin-film interference filter on one of the metal mirrors.

8. The electronic device defined in claim 1 further comprising a light collimator configured to collimate the ambient light and before the ambient light passes through the tunable filter.

9. The electronic device defined in claim 8 wherein the light collimator has first and second layers with prism structures.

10. The electronic device defined in claim 9 wherein the prism structures of the first layer comprise parallel prism-shaped ridges that run along a first direction and wherein the prism structures of the second layer comprise parallel prism-shaped ridges that run along a second direction that is perpendicular to the first direction.

11. The electronic device defined in claim 9 wherein the display is covered by a display cover layer, the electronic device further comprising:
a light diffuser layer interposed between the display cover layer and the first layer.

12. The electronic device defined in claim 1 further comprising a display cover layer overlapping the display, wherein the ambient light passes through the display cover layer before passing through the tunable filter.

13. The electronic device defined in claim 1 wherein the control circuitry is configured to adjust a color cast of the content based on the measured ambient light spectrum.

14. A color ambient light sensor, comprising:
a semiconductor substrate;
a photodiode on the semiconductor substrate;
analog-to-digital converter circuitry in the semiconductor substrate that is configured to digitize signals from the photodiode; and
a tunable light filter overlapping the photodiode and having a passband that is adjustable across a visible light spectrum.

15. The color ambient light sensor defined in claim 14 wherein the tunable light filter comprises an electrically adjustable Fabry-Perot resonator formed from a microelectromechanical systems device.

16. The color ambient light sensor defined in claim 15 further comprising a light collimator that is configured to collimate ambient light and provide the collimated ambient light to the photodiode through the Fabry-Perot resonator.

17. The color ambient light sensor defined in claim 16 further comprising an infrared-light-blocking-and-visible-light-transmitting thin-film interference filter that overlaps the photodiode.

18. An electronic device, comprising:
a display configured to display an image;
a light collimator configured to receive ambient light;
an adjustable filter that receives the ambient light from the light collimator;
a light detector configured to measure a color of the ambient light;
an infrared-light-blocking-and-visible-light-transmitting filter interposed between the adjustable filter and the light detector; and
control circuitry configured to adjust a color cast of the image on the display based on signals from the light detector so that the color cast of the image more closely matches the color of ambient light.

19. The electronic device defined in claim 18 wherein the adjustable filter comprises an electrically adjustable Fabry-Perot resonator and wherein the control circuitry is configured to sweep a passband associated with the Fabry-Perot resonator over a wavelength range that includes visible light wavelengths while measuring the signals from the light detector to measure an ambient light spectrum for the ambient light.

\* \* \* \* \*